(12) United States Patent
Djekic

(10) Patent No.: US 6,963,130 B1
(45) Date of Patent: Nov. 8, 2005

(54) HEATSINKING AND PACKAGING OF INTEGRATED CIRCUIT CHIPS

(75) Inventor: Ognjen Djekic, Fremont, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 64 days.

(21) Appl. No.: 10/936,899

(22) Filed: Sep. 8, 2004

Related U.S. Application Data

(63) Continuation of application No. 10/154,026, filed on May 22, 2002, now Pat. No. 6,853,068.

(51) Int. Cl.[7] .......................... H01L 23/10; H01L 23/34
(52) U.S. Cl. ...................... 257/706; 257/707; 257/708; 257/709; 257/710; 257/711; 257/712; 257/713
(58) Field of Search ............................... 257/705–713

(56) References Cited

U.S. PATENT DOCUMENTS

| | | | | |
|---|---|---|---|---|
| 5,926,371 A | * | 7/1999 | Dolbear | 361/704 |
| 6,411,507 B1 | * | 6/2002 | Akram | 361/690 |
| 6,504,243 B1 | * | 1/2003 | Andric et al. | 257/718 |

* cited by examiner

*Primary Examiner*—Thien F Tran
(74) *Attorney, Agent, or Firm*—Fish & Richardson P.C.

(57) ABSTRACT

A semiconductor package has a printed circuit board, an integrated circuit chip on the printed circuit board with an exposed semiconductor die, and a rigid structure secured to the printed circuit board and enclosing the exposed semiconductor die. The exposed surface of the semiconductor die placed is in thermal contact with an inner surface of the rigid structure with a compressible material.

11 Claims, 1 Drawing Sheet

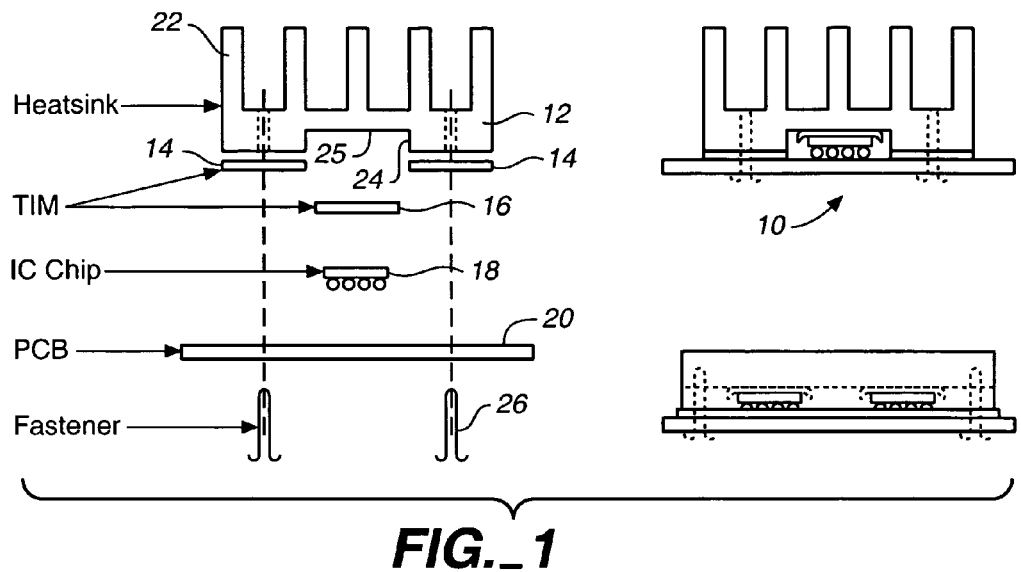
FIG._1
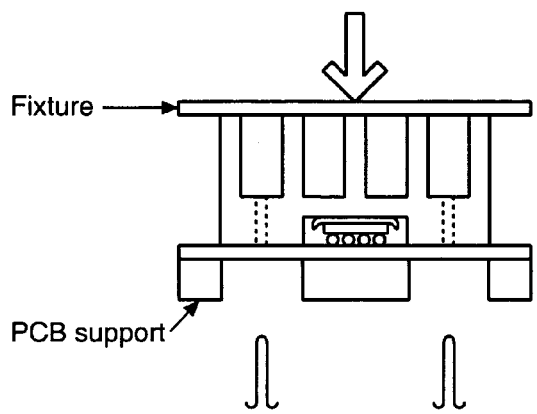
FIG._2
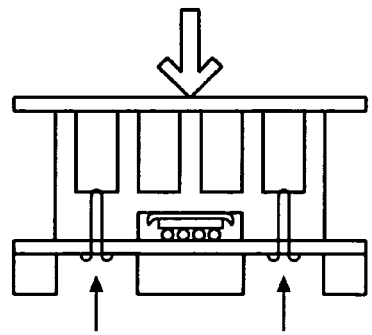
FIG._3
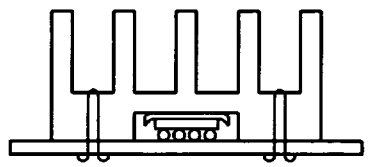
FIG._4

HEATSINKING AND PACKAGING OF INTEGRATED CIRCUIT CHIPS

CROSS-REFERENCE TO RELATED APPLICATIONS

Under 35 U.S.C. §120, this application is a continuation application of and claims priority to U.S. patent application Ser. No. 10/154,026, filed May 22, 2002, the entire contents of which are incorporated by reference herein, now U.S. Pat. No. 6,853,068.

BACKGROUND

This invention relates to heatsinks and packaging of integrated circuit chips.

Due to significant power dissipation in integrated circuit (IC) chips, such as chip scale package (CSP) power devices, it is often necessary to attach an external heatsink in order to keep the device junction temperature below its rated value. However, in CSP devices, the bare die is exposed to the environment. Therefore, special care must be taken to avoid excessive pressure when a heatsink is attached, in order to avoid damaging the die.

Descriptions of various prior art heatsink packages can be found in the following patents: U.S. Pat. No. 5,367,193, entitled "Low cost, thermally efficient, and surface mountable semiconductor package for a high applied power VLSI die", U.S. Pat. No. 5,789,810, entitled "Semiconductor cap", U.S. Pat. No. 5,905,636, entitled "Heat dissipation apparatus and method for attaching a heat dissipation apparatus to an electronic device", U.S. Pat. No. 5,909,057, entitled "Integrated heat spreader/stiffener with apertures for semiconductor package", U.S. Pat. No. 6,069,023, entitled "Attaching heat sinks directly to flip chips and ceramic chip carriers", U.S. Pat. No. 6,175,500, entitled "Surface mount thermal connections", and U.S. Pat. No. 6,255,140, entitled "Flip Chip Chip-Scale Package".

SUMMARY

In one aspect, the invention is directed to a semiconductor package. The package has a printed circuit board, an integrated circuit chip on the printed circuit board with an exposed semiconductor die, a rigid structure secured to the printed circuit board and enclosing the exposed semiconductor die, and a compressible material between an exposed surface of the semiconductor die and an inner surface of the rigid structure.

Implementations of the invention may include one or more of the following features. The rigid structure and the compressible material may be thermally conductive and/or electrically insulating. The semiconductor die may be a flipchip. The rigid structure may include a body having a groove formed therein, and the die may be located in the groove. A depth of the groove may be preselected to compress the compressible material by between about three-quarters and one-half. The compressible material may have an uncompressed depth of about 20 mils. The compressible material may be located between a top surface of the semiconductor die and a bottom surface of the groove. The compressible material may be sufficiently soft that it applies about 100 psi or less to the semiconductor die during attachment of the rigid structure to the printed circuit board. The compressible material may be a pad or a flowable material. The rigid structure may thermally contact the printed circuit board. A thermally conductive layer may be secured between the rigid structure and the printed circuit board. Mechanical fasteners, such as rivets, may secure the printed circuit board to the rigid structure.

In another aspect, the invention is directed to a semiconductor package. The package has a printed circuit board, an integrated circuit chip on the printed circuit board with an exposed semiconductor die, and a rigid structure secured to the printed circuit board and enclosing the exposed semiconductor die. An exposed surface of the semiconductor die is in thermal contact with an inner surface of the rigid structure.

Implementations of the invention may include one or more of the following features. A thermally conductive compressible material may be located between the exposed surface of the semiconductor die and the inner surface of the rigid structure. The compressible material may be sufficiently soft that it does not damage the semiconductor die during attachment of the rigid structure to the printed circuit board. The rigid structure may thermally contact the printed circuit board. A thermally conductive layer may be secured between the rigid structure and the printed circuit board.

In one aspect, the invention is directed to a semiconductor package. The package has a printed circuit board, a semiconductor die on the printed circuit board, and a heatsink having a first surface in thermal contact with the printed circuit board and a second surface in thermal contact with the semiconductor die.

Implementation of the invention may include one or more of the following features. A thermally conductive first layer may be located between the printed circuit board and the heatsink, and a thermally conductive second layer may be located between the semiconductor die and the heatsink. The first and second layers may be electrically insulating. The heatsink may include a bottom surface with a recess formed therein. A portion of the bottom surface surrounding the recess may provide the first surface, and a portion of the bottom surface in the recess may provides the second surface. Mechanical fasteners, such as rivets, may secure the heatsink to the printed circuit board. The die need not be secured to the heatsink. The first and second surfaces may be substantially flat.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a schematic cross-sectional view of a heatsink assembly in accord with the present invention.

FIGS. 2–4 are schematic cross-sectional views illustrating steps in the process of assembling the package with the heatsink, chip and printed circuit board.

Like reference symbols in the various drawings indicate like elements.

DETAILED DESCRIPTION

Referring to FIG. 1, a proposed semiconductor die package or heatsink assembly 10 includes a heatsink 12, the IC chip 18, a printed circuit board (PCB) 20, a first layer of thermally conductive electrically insulating interface material 16 between the IC chip 18 and the heatsink 12, an optional second layer of thermally conductive electrically insulating interface material 14 between the heatsink 12 and the printed circuit board 20, and one or more fasteners 26.

The IC chip can be a chip scale package (CSP) power device with an exposed semiconductor die surface, and can be a flip-chip device. Optionally, the IC chip 18 can include an interface layer between the die and the printed circuit board 20.

The thermally conductive interface material 16 provides a first conductive thermal path from the heat generating device (CSP device 18) into the heatsink 12. In addition, the interface material 16 is soft, compliant and compressible to provide cushioning between the chip 18 and the heatsink 12, so as to reduce the danger of damage to the CSP die. The interface material 16 can be a pad of material, or it can be a flowable material, such as a viscoelastic material, e.g., a paste-like material, or it can be a loose material, such as a granular material. If the interface material is a flowable material, it can be dispensed directly onto the IC chip 18. The interface material can be a silicone-based soft material, such as T-Putty 504 from Thermagon, located in Cleveland, Ohio.

The heatsink 12 is attached to the PCB 20 upon completion of the standard surface mount component assembly. A groove or recess 24 is formed in the bottom surface of the heatsink 12, and the chip 18 fits into the recess 24. Thus, a portion of the bottom surface of the heatsink surrounding the recess 24 is abuts the PCB 20. Both the inner surface 25 of the recess 24 and the bottom surface of the body of the heatsink can be substantially flat. This construction permits effective, safe, and manufacturable heatsink attachment to a single or multiple IC chips. In addition, the heatsink acts as a rigid structure that encloses the chip, thereby protecting it from the environment (without enclosing the entire circuit board).

Because the heatsink rests on the PCB, the maximum amount of pressure that can be applied to the CSP 18 during heatsink assembly is limited, thereby reducing the risk of damage to the CSP die. That is, the position of the inner surface 25 of the recess 24 relative to the top of the CPS 18 is set by the depth of the recess 24, and this depth can be selected so as to limit the compression of the interface material 16 and the resulting pressure on the CSP 18. Assuming that the interface material 16 is a solid pad, the depth of the recess 24 can be selected so that the interface material is compressed by between about three-quarters and one-half. For example, if the thickness of the interface layer is 20 mils, then the depth of the recess can be set equal to the nominal height of the chip 18, plus about 14 mils. If the interface material 16 is a flowable material, it could be compressed by more than one-half, as the material can flows into recesses and the like. In this case, the depth of the recess 24 can be selected so that the top of the chip is a set distance, e.g., 1 to 4 mils, from the inner surface of the recess.

In general, the interface material 16 is sufficiently soft that it does not damage the semiconductor die during attachment of the rigid structure to the printed circuit board. For example, the first interface material 16 can be sufficiently soft that it applies about 100 psi or less to the semiconductor die during attachment procedure.

The portion of the bottom surface of the heatsink surrounding the recess 24 can be in thermal contact with the PCB 20 to provide a "board-level" heatsinking. For example, the heatsink 12 can rest on and be in thermal contact with the PCB 20 via the optional thermal conductive interface material 14. The interface material 14 can be harder than the interface material 16. A suitable interface material can be a silicone-based soft material, such as T-Pli 510, also from Thermagon.

The heatsink 12 is electrically insulated from the PCB 20 using the electrically insulating but highly thermally conductive thermal interface material (TIM) 14. Consequently, the interface material 14 provides a second highly conductive thermal path from the heat generating device (CSP) through the PCB into the heatsink 12. This feature improves the cooling of the CSP device by maintaining the PCB at a lower temperature.

The top of the heatsink can be a flat plate, or it can include fins 22, such as straight fins, elliptical fins, cross-cut fins, and the like.

The heatsink can be applied to a single chip or to multiple chips in a single manufacturing step. One configuration when heatsinking multiple chips is to have the chips lined up in a single row with the groove or recess 24 in the base of the heatsink 12. This groove or recess can be oriented in the same direction as the fins 22, although this is not required. In addition, the body of the heatsink can include two or more grooves or recesses in its bottom surface. These recesses can be parallel to each other and/or parallel to the direction of the fins, although this is not required.

The heatsink completely covers all of the chips and acts both as a heat spreader, board stiffener, and as a protective package. The heatsink is not bonded to the package. Instead, the package is interfaced to the heatsink through a soft, compliant TIM. In this way, the heatsink will not impact the CSP board level reliability by stressing the die due to the mismatch in thermal expansion coefficients of the heatsink, the PCB, and the die.

The heatsink is secured to the PCB using mechanical fasteners 26, such as rivets or screws. The fasteners 26 pass through the PCB 20 and the interface material 14, and into receiving recesses in the heatsink 12. Any mechanical fastener can be used, although there is no need for clamp/torque control. Consequently, inexpensive fasteners such as rivets can be used.

A method of assembly may proceed as shown in FIGS. 2–4. First, the surface of the heatsink is cleaned. The surface is allowed to dry before applying the thermal interface material to the heatsink. Next, the interface material is placed into the groove of the heatsink. The PCB is placed into a fixture, and the heatsink is positioned on the PCB (see FIG. 2). Care can be taken so that the PCB is properly supported in order to insure that it will not flex during heatsink attach. The fixture is closed, and sufficient pressure is applied to compress the TIM and seat the heatsink onto the PCB (see FIG. 3). Because the heatsink construction protects the chip, the applied force need not be controlled precisely (although very high forces can still damage the PCB). Next, using a riveting tool, such as a bottom-up riveting tool available from Textron, the rivet is applied to secure the heatsink assembly. Finally, the assembled unit is removed from the fixture (see FIG. 4).

Potential advantages of the invention may include one or more of the following.

The heatsink configuration can be used with single or multiple packages by simply choosing the appropriate length of the heatsink. The heatsink can have multiple CSP packages in a single row with a single groove or in multiple rows with multiple grooves. Thus, the heatsink provides a flexible, modular design. Multiple chips can be cooled using a single heatsink. This can maximize the heatsinking surface area on a given board and reduce manufacturing costs since only a single heatsink needs to be applied.

The heatsink configuration can provide effective cooling of power devices in a CSP because the heatsink is attached directly to the die through a highly thermally conductive interface material.

The heatsink shape can limit the amount of force that can be applied to the CSP and control the maximum amount of pressure that is applied to the CSP. The heatsink can protect the CSP from mechanical damage during handling or operation in the field. Since the heatsink covers the CSP, it can act as a package as well as a heatsink, and it can protect the CSP from chipping and other mechanical damage. The heatsink does not mechanically the CSP. Since the heatsink is not bonded to the device package, any mismatch between thermal expansion coefficients of CSP, PCB and the heatsink need not cause stress to the CSP. Therefore, attaching the heatsink need not impact board-level reliability of the CSP.

The heatsink can remove heat from both the CSP package and the PCB around the package. The heatsink can improve device cooling by pulling heat out of the PC board. Additional heat transfer into the heatsink can be achieved by interfacing the heatsink feet to the PCB copper plane connected to the power pins of the CSP. By doing this, the overall thermal resistance from junction to heatsink can be reduced, thereby improving the cooling of the CSP part. By cooling the PC board around the CSP, the heatsink can maintain a lower PCB temperature. By interfacing the heatsink to the PCB through-using a TIM, heat that is being pumped into the PCB by the CSP part can more effectively be removed from the PCB. This results in better cooling of the CSP and a lower PCB temperature.

The heatsink can be manufactured using a standard extrusion process. The groove in the heatsink can be designed to be parallel to the fins, the groove and the fins can be created in a single extrusion step. Therefore, a heatsink with a groove can be easy and inexpensive to manufacture.

The heatsink can act as a PCB stiffener. A bare die of a chip can be heatsinked. Any type of heatsink or any size of heatsink can be attached to the CSP. A rigid heatsink can be attached to a CSP package. The resulting assembly can be reworkable, i.e., the heatsink can be removed from the printed circuit board without removing the chip.

A number of embodiments of the invention have been described. Nevertheless, it will be understood that various modifications may be made without departing from the spirit and scope of the invention.

For example, although FIGS. 2–4 illustrate a heatsink that completely encloses the chip with a solid housing, one or more apertures could be formed in the portion of the heatsink that extends downwardly to contact the printed circuit board. For example, the a portion of the heatsink along two sides of the chip could be cut away. In this implementation, the heatsink would contact the printed circuit board along two parallel strips on opposite sides of the chip, but would not contact the printed circuit board on the two remaining sides of the chip. In another implementation, the gaps or apertures could be cut in the heatsink on one or more sides of the chip. In another implementation, the heatsink could include downwardly-extending discrete posts to contact the printed circuit board, rather than an elongated strip. For example, there could be one post at each corner of the chip.

Accordingly, other embodiments are within the scope of the following claims.

What is claimed is:

1. A semiconductor package, comprising:
a printed circuit board;
an integrated circuit chip on the printed circuit board, the integrated circuit chip having an exposed semiconductor die;
a rigid structure secured to the printed circuit board, the rigid structure being thermally conductive and including a body having a groove formed therein, the rigid structure enclosing the exposed semiconductor die, the exposed semiconductor die being located in the groove; and
a compressible material between an exposed surface of the semiconductor die and an inner surface of the rigid structure, the compressible material being thermally conductive,
wherein a depth of the groove is pre-selected to compress the compressible material by between about three-quarters and one-half.

2. The package of claim 1, wherein the rigid structure and the compressible material are electrically insulating.

3. The package of claim 1, wherein the semiconductor die comprises a flipchip.

4. The package of claim 1, wherein the compressible material is located between a top surface of the semiconductor die and a bottom surface of the groove.

5. The package of claim 1, wherein the compressible material comprises a pad.

6. The package of claim 1, wherein the compressible material comprises a flowable material.

7. The package of claim 1, wherein the rigid structure has one or more apertures formed in one or more portions of the rigid structure that extends downwardly to contact the printed circuit board.

8. The package of claim 1, wherein the rigid structure is in thermal contact with the printed circuit board.

9. The package of claim 8, further comprising a thermally conductive layer secured between the rigid structure and the printed circuit board.

10. The package of claim 1, further comprising mechanical fasteners to secure the printed circuit board to the rigid structure.

11. The package of claim 10, wherein the mechanical fasteners comprise rivets.

* * * * *